US009276197B2

(12) United States Patent
Johnson et al.

(10) Patent No.: US 9,276,197 B2
(45) Date of Patent: Mar. 1, 2016

(54) HYBRID DOMAIN WALL-HALL CROSS DEVICE

(71) Applicants: Mark B. Johnson, Potomac, MD (US); Christopher Malec, Alexandria, VA (US)

(72) Inventors: Mark B. Johnson, Potomac, MD (US); Christopher Malec, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/536,872

(22) Filed: Nov. 10, 2014

(65) Prior Publication Data

US 2015/0137200 A1 May 21, 2015

Related U.S. Application Data

(60) Provisional application No. 61/907,157, filed on Nov. 21, 2013.

(51) Int. Cl.
| | |
|---|---|
| *H01L 43/06* | (2006.01) |
| *G11C 11/18* | (2006.01) |
| *H01L 43/04* | (2006.01) |
| *G11C 11/16* | (2006.01) |

(52) U.S. Cl.
CPC ............ *H01L 43/065* (2013.01); *G11C 11/161* (2013.01); *G11C 11/18* (2013.01); *H01L 43/04* (2013.01)

(58) Field of Classification Search
CPC ..... H01L 27/222; H01L 43/06; H01L 43/065; H01L 43/08
USPC .................................. 257/421–427, E43.003
See application file for complete search history.

(56) References Cited

U.S. PATENT DOCUMENTS 4,223,292 A * 9/1980 Morikawa et al. .......... 338/32 H
5,652,445 A   7/1997 Johnson
(Continued)

OTHER PUBLICATIONS

Mark Johnson, B. Bennett, M.J. Yang, M.M. Miller and B.V. Shanabrook, Hybrid Hall Effect Device, Appl. Phys. Lett. 71, 974 (1997).
(Continued)

*Primary Examiner* — Michael Lebentritt
(74) *Attorney, Agent, or Firm* — US Naval Research Laboratory; L. George Legg; Kerry L. Broone

(57) ABSTRACT

A hybrid domain wall Hall cross device consists of a semiconductor Hall cross having a top surface and a pair of arms intersecting at a center region, and a ferromagnetic wire fabricated on the top surface, electrically isolated from the Hall cross, and having a constriction proximate to the center of the Hall cross. The device provides a magnetoelectronic MRAM storage cell with improved performance characteristics. Binary storage is associated with a trapped domain wall having one of two stable orientations. The bit state can be written using current driven domain wall motion. This is a STT process in which the write current is applied to a thin film, low impedance wire. Heating is minimized and no wear-out mechanism is known to exist.

15 Claims, 6 Drawing Sheets

(56) References Cited

U.S. PATENT DOCUMENTS

| | | | |
|---|---|---|---|
| 5,721,654 A * | 2/1998 | Manako et al. | 360/110 |
| 6,624,490 B2 * | 9/2003 | Flatte et al. | 257/421 |
| 7,372,119 B2 * | 5/2008 | Nakamura et al. | 257/427 |
| 7,742,333 B2 * | 6/2010 | Lee et al. | 365/170 |
| 8,299,778 B2 * | 10/2012 | Haddab et al. | 324/117 H |
| 8,357,983 B1 * | 1/2013 | Wang | 257/427 |
| 2003/0184460 A1 * | 10/2003 | Johnson et al. | 341/133 |
| 2004/0018644 A1 * | 1/2004 | Johnson et al. | 436/526 |
| 2007/0046287 A1 * | 3/2007 | Vervaeke et al. | 324/251 |
| 2007/0171695 A1 * | 7/2007 | Aouba et al. | 365/145 |
| 2008/0048179 A1 * | 2/2008 | Shin et al. | 257/40 |
| 2011/0037464 A1 * | 2/2011 | Gurney et al. | 324/252 |

OTHER PUBLICATIONS

Mark Johnson, B.R. Bennett, P. R. Hammar and M.M. Miller, "Magnetoelectronic Latching Boolean Gate," Solid State Electronics 44, 1099 (2000).

P. Lendecke et al., Temperature dependence of domain-wall depinning fields in constricted Permalloy nanowires, Appl. Phys. Lett. 103, 073909 (2008).

* cited by examiner

US 9,276,197 B2

HYBRID DOMAIN WALL-HALL CROSS DEVICE

CROSS-REFERENCE TO RELATED APPLICATIONS

This Application claims the benefit of U.S. Provisional Application 61/907,157 filed on Nov. 21, 2013, and incorporated herein by reference.

FIELD OF THE INVENTION

The invention is directed to a magnetic random access memory (MRAM) digital storage cell device, and more particularly to a hybrid domain wall Hall cross MRAM digital storage cell device.

BACKGROUND OF THE INVENTION

Magnetoelectronic devices incorporate a ferromagnetic material as part of a digital electronic device and use the bistability of magnetic hysteresis as a basis for nonvolatile storage. High performance integrated magnetic random access memory (MRAM) chips have been commercially available since 2006 and are highly competitive with semiconductor static random access memory (SRAM). The dominant magnetoelectronic device that's used as the storage cell in MRAM is the magnetic tunnel junction (MTJ). The MTJ in a storage cell has a pinned ferromagnetic layer (FP) and a free ferromagnetic layer (FF) that are separated by a tunnel barrier (FIGS. 1A-B). The free layer has a uniaxial anisotropy axis (along the x-axis in FIG. 1A) such that the magnetization has two stable states, parallel or antiparallel with the magnetization orientation of FP. Commercial MRAM cells face two roadblocks that stand in the way of achieving higher bit-count chips and broader market penetration.

The first issue involves the write process. This process uses integrated "write wires." A two dimensional array of cells is overlaid with a two dimensional array of rows and columns of write wires. Each write wire is inductively coupled to each cell in the row or column. A current pulse applied to any wire has a local magnetic field associated with the current. To write a cell at location (j, m), a "half-select" process is used. The current pulse amplitude $I_W$ is chosen to be sufficiently small that the fringe field does not disturb the orientation of $F_P$ of any cell along the row or column. However, the sum of the fringe fields of pulses with amplitude $I_W$ applied to a row wire and a column wire will be sufficiently large to flip the magnetization state of FP at the intersection of the two wires, for example the cell at (j, m). This write process is called "Oersted" writing. The current pulse amplitudes are relatively large and the power dissipation is high. Furthermore, this write process is not scalable: when the cell size is reduced, the write power is not reduced.

An alternative to "Oersted" writing is called the "Spin Torque Transfer" (STT) write process. In this technique, spin polarized electric current from a reference ferromagnetic layer are driven into FP. Spin angular momentum from this "write" current is transferred to the conduction electrons in FP and, for sufficient current amplitude and pulse durations of order 1 nsec, the magnetization orientation of FP is set. This technique requires an architecture with a "select" transistor for each cell. However, the STT write process uses less current than the Oersted process. Of more importance, STT writing is scalable: the write current decreases as the cell size decreases.

Research on the STT process applied to MTJ cells is advanced, but the technique has fallibilities that have limited commercialization. The pinned layer can be used as the reference layer, but driving the STT current across the tunnel barrier creates heat. The application of repeated write pulses deteriorates the barrier and leaves it susceptible to dielectric breakdown. Referring now to FIG. 1B, the write current $I_{write}$ is driven across tunnel barrier. A high write voltage dissipates high power which eventually degrades the tunnel barrier and destroys the MTJ.

The second issue involves reading out the datum value (cell readout). The product of MTJ area and resistance, RA, is constant for a given materials stack. As the area A decreases, the device resistance increases as the square of the feature size f. The best materials stacks are characterized by RA values of roughly 500Ω-μm$^2$. For a commercially competitive prototype with f=50 nm, the resistance is R=0.2 MΩ. The MTJ readout voltages (~50 mV) are supplied to "sense amplifiers" matched to 50Ω impedance circuits. The 0.2 MΩ output impedance provides a large impedance mismatch that dramatically diminishes the readout performance.

BRIEF SUMMARY OF THE INVENTION

According to the invention, a hybrid domain wall Hall cross device consists of a semiconductor Hall cross having a top surface and a pair of arms intersecting at a center region, and a ferromagnetic wire fabricated on the top surface, electrically isolated from the Hall cross, and having a constriction proximate to the center of the Hall cross.

The device provides a magnetoelectronic MRAM storage cell with improved performance characteristics. Binary storage is associated with a trapped domain wall having one of two stable orientations. The bit state can be written using current driven domain wall motion. This is a STT process in which the write current is applied to a thin film, low impedance wire. Heating is minimized and no wear-out mechanism is known to exist. Readout is provided by a Hall voltage of order 1 to 10 mV. The output impedance of roughly 200Ω is a reasonably good match to 50Ω circuitry.

DETAILED DESCRIPTION OF THE INVENTION

Figure 1A:
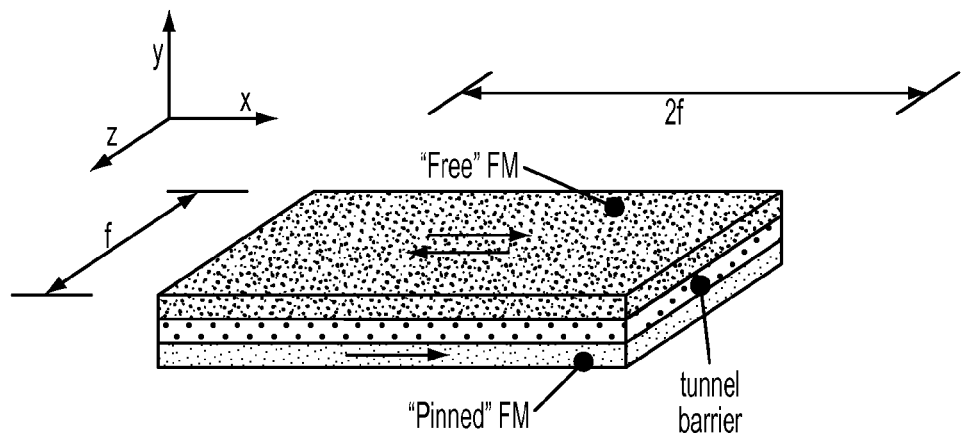
FIGS. 1A-B are schematic representations of a prior art magnetic tunnel junction (MTJ)
Figure 1B:
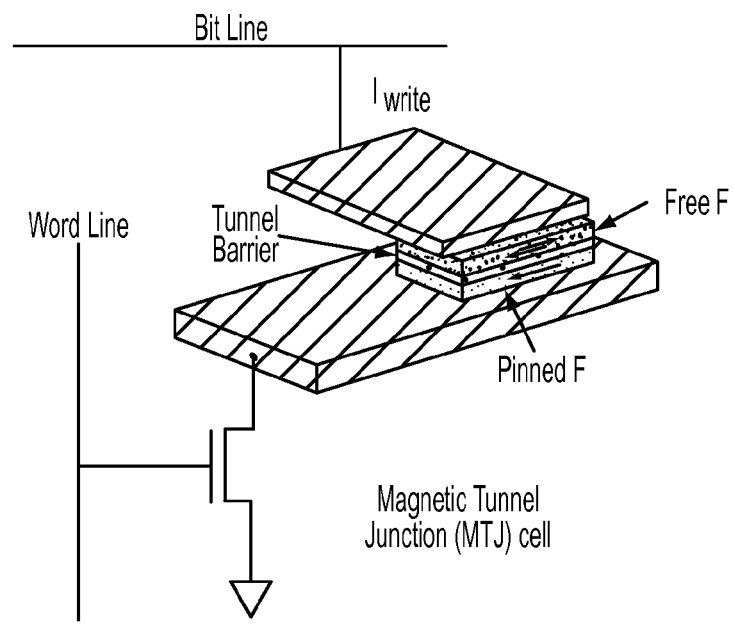
Figure 2:
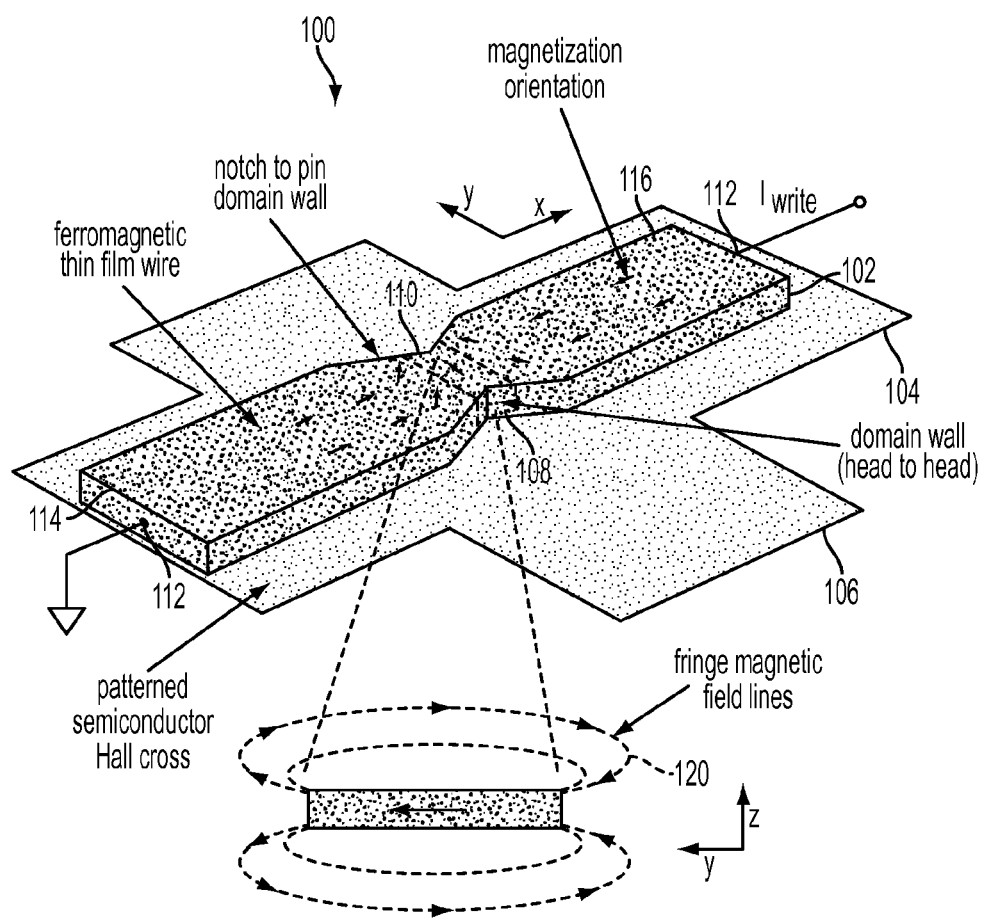
FIG. 2 is a schematic perspective view of a hybrid domain wall/Hall cross device, with the inset showing a cross section of a domain wall pinned in the vicinity of the constriction.

Referring now to FIG. 2, a hybrid domain wall-hall cross device 100 according to the invention includes a narrow ferromagnetic wire 102 fabricated on a top surface 104 of a semiconductor Hall cross 106 and insulated from Hall cross 106 by a suitable electrical-isolating layer/material, and with a constriction 108 near the center 110 of the Hall cross 106. The preferred Hall cross 106 is a high mobility single quantum well (SQW) two dimensional electron system (2DES). The plane of the 2DES is the x-y plane. The wire 102 (a modification of Johnson's metallic "F" layer", as described below) is electrically isolated from the Hall cross but in close proximity with the SQW. Layer F is to be fabricated with a uniaxial magnetization anisotropy so that it has two bistable magnetic states, positive or negative along the anisotropy axis (x-axis in FIG. 2). Fringe magnetic field 120 from the edge of 102 and near the center 110 has a large component along the z-axis, perpendicular to the plane of the 2DES. A bias current applied along the x-axis Hall cross arms would result in a Hall voltage measured along the y-axis Hall cross arms. The sign of the Hall voltage changes when the magnetization changes from one bistable state to the other, because the sign of the z-component of local magnetic field changes.

U.S. Pat. No. 5,652,445 "Hybrid Hall Effect Device and Method of Operation", Mark B. Johnson, issued Jul. 29, 1997 ("Johnson"), and incorporated herein by reference, describes a hybrid ferromagnet semiconductor structure, as a nonvolatile memory cell, that can be employed as the hybrid domain wall-hall cross device 100 as modified for use in the invention. Johnson describes, for an array of cells, a two dimensional array of integrated write wires is fabricated with inductive coupling to the ferromagnetic elements. The intersection of each pair of wires in the array is located over the F element of a cell. The binary state of the cell is to be written using a half-select process, sending current pulses down one horizontal wire (j) and one vertical wire (n) such that the vector sum of the local Oersted fields at the intersection of the wires is sufficient to set the magnetization state of F element of cell (j,m). The local field at the position of any other cell along wire j or wire m is not sufficient to disturb the state of that cell.

P. Lendecke et al., "Temperature dependence of domain-wall depinning fields in constricted Permalloy nanowires", *J. Appl. Phys.* 103, 073909 (2008) ("Lendecke et al.") have shown that a similar hybrid structure can be used to detect the presence of a magnetic domain wall pinned at a geometric constriction in a narrow, thin film ferromagnetic rectangle. Lendecke et al. used a Hall cross, fabricated from a GaAs/AlGaAs heterostructure, having arms with widths of about 1 micron. The ferromagnetic metal rectangle was about half a micron wide and roughly 10 microns long and was fabricated on top of the Hall cross.

The device 100 is a modification of the Johnson hybrid ferromagnet-semiconductor device. Unlike Johnson's thin film ferromagnet layer (F), the F element is now replaced with the narrow wire 102 with dimensions that continue along the x-axis, beyond the central region 110 of the Hall cross 106. The lithographically defined constriction 108 is fabricated near the center 110 of the cross. When an external magnetic field $H_x$ is applied, the magnetization of the ferromagnetic wire FW 102 reverses and a domain wall (DW) propagates from one end of the wire to the other. For a field swept from negative to positive values, the wall is pinned at the constriction 108 at a value $+H_{x;p1}$ and depinned at a larger value, $H_{x;p2}$. Fringe field 120 from portions of the DW (including the ends) have a component along the z-axis and generate a voltage in the Hall cross arms that parallel the y-axis. The arrows in FIG. 2 represent the magnetization orientation of two domains in the wire and of a single domain wall. The figure depicts two "head to head" domains. The wire 102 is sufficiently thin and narrow that a Neel wall forms in between the two domains, and this domain wall (DW) is pinned in the vicinity of the notch 108 in the wire. When the thickness of the FW is slightly larger, a domain vortex will accompany the Neel wall. The $+H_{x;p1}$ and $H_{x;p2}$ values may be different, but the device functions in the same way. Furthermore, the device can be operated by applying bias current to the arms along the y axis and measuring voltage with the arms along x.

In the Hybrid Domain Wall/Hall Cross Device 100, the key difference with respect to prior art such as Lendecke et al. is that the wire 102 fabricated on top of the Hall cross 106 is continuous and extends to contact an electrode 112 on each end 114 and 116. A second difference with respect to Lendecke et al. is that the Hall cross 106 is fabricated using an InAs heterostructure that has high mobility at room temperature. All test measurements on prototypes of the present invention have been performed at room temperature. Hall cross 106 preferably has a size in the range of from 10 nm to 1 micron and wire 102 a width in the range of from 10 nm to 500 nm. Hall cross 106 is preferably Si or Ge or a compound of either Si or Ge.

Figure 3:
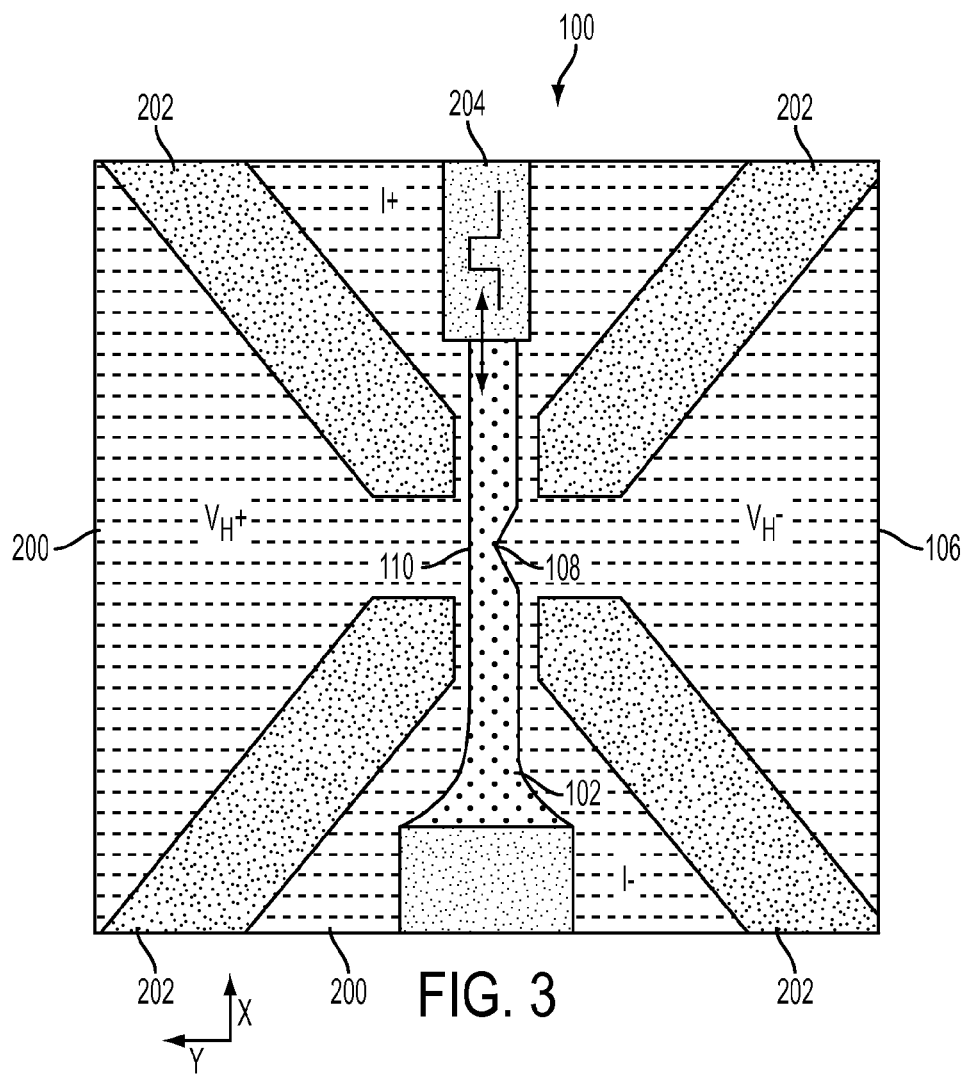
FIG. 3 is a Scanning Electron Microscope (SEM) image of a prototype hybrid domain wall Hall cross device according to the invention.

FIG. 3 shows an SEM image of a prototype hybrid DW/Hall device 100 of the invention useful as a nonvolatile memory cell. A domain wall is nucleated at one end of the wire 102 and then can be moved into, or out of, the "trap" by the use of spin torque transfer electric current pulses. This process writes the bit state of the cell. This state is retained without power (nonvolatile) until erased or re-written by a new write pulse. In the readout process, bias current is applied between the arms denoted I+ and I−. The presence of a head to head or tail to tail domain wall in the trap is detected by the Hall voltage measured between the arms denoted $V_H+$ and $V_H-$. The readout measurement can use pulsed bias current with detection of voltage pulses, and also can be performed by switching the I and V Hall cross arms. Device 100 in one embodiment includes an InAs single quantum well mesa structure 200 with Hall cross 106 defined, mesa isolation trenches (insulator) 202, permalloy wire 102 with notch 108 near center 110 of Hall cross 106, and a thin film leads 204. The vertical Hall cross arms can be biased with audio frequency or dc current or single current pulses. The Hall readout voltage $V_H$ is sensed between the two horizontal arms. A current pulse can be transmitted along the axis of the FW, along either positive or negative y.

Figure 4:
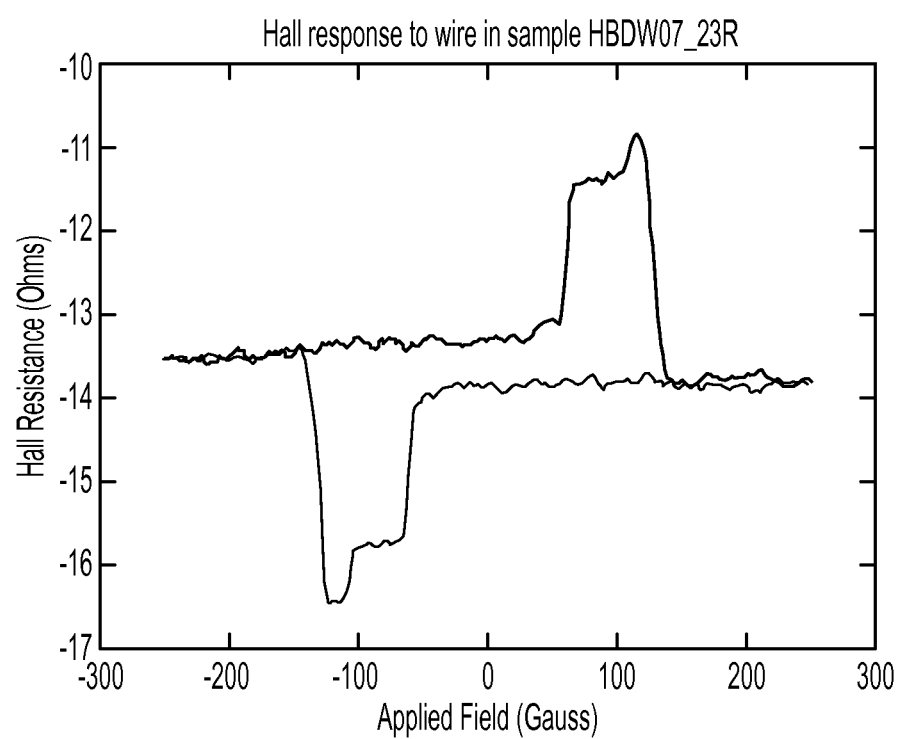
FIG. 4 shows the Hall voltage response as a function of external magnetic field, with the Hall response displayed as V/I (Ohms), of the device of FIG. 4.

The readout characteristics of the prototype device 100 can be seen in the data example shown in FIG. 4. All measurements are at room temperature. An external magnetic field H is swept along the x axis (FIG. 3). At a negative field, H∼−250 Oe, a DW is nucleated at one end of the wire. The field is swept from negative towards positive values (blue trace). At H>0, the DW moves along the wire and enters the trap at a field of H∼50 Oe. The voltage increases from V/I=−13.5Ω to V/I=−10.8Ω, where the change in voltage ΔV results from the Hall voltage of the fringe magnetic field. At a field H∼120 Oe, the DW is depinned from the trap and moves to the other end of the wire. The voltage decreases from V/I=−10.8Ω to V/I=−13.8Ω. In an ideal device, the baseline voltage $V_B$ (measured at H=±250 Oe) would be zero. A small lithographic asymmetry in fabrication of the Hall cross can create an offset voltage, $V_B$ not equal to 0. In this prototype device, the value of $V_B/I$ is about −13.7Ω. For a field sweep from positive towards negative values (green trace), the same sequence of events occurs. It is noted that the voltage change ΔV between a peak (or dip) and baseline is large (ΔV/I is several Ohms) and the signal to noise ratio (SNR) associated with DW detection is high. Bias currents as large as ∼200 μA have been used and values ΔV∼1 mV have been detected. These data (T=295 K) are similar, qualitatively and quantitatively, to data presented in Lendecke et al. at temperatures of about 20 K.

Figure 5:
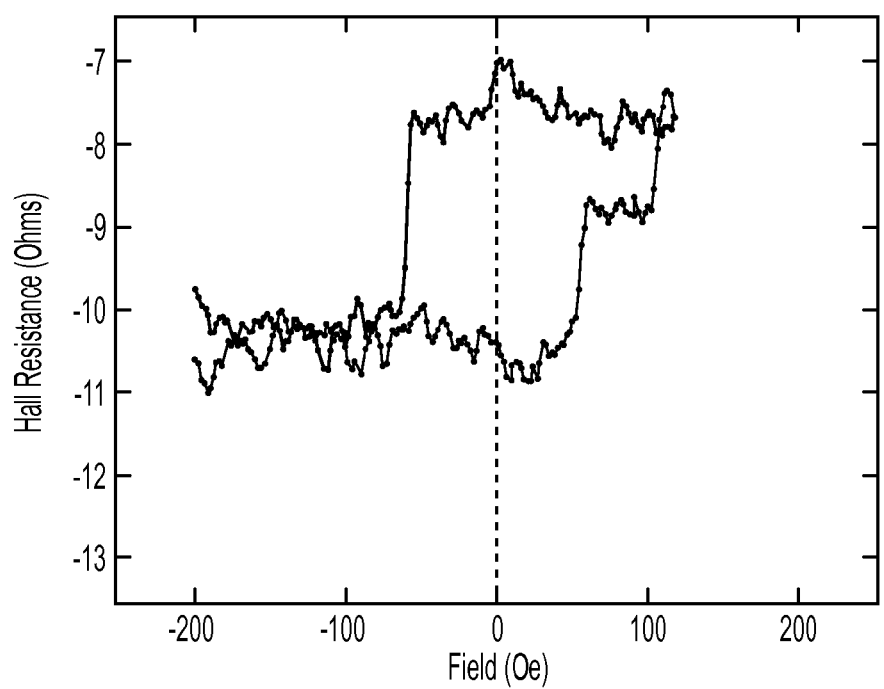
FIG. 5 is a graph of data demonstrating a memory effect for the device of FIG. 4.

The data in FIG. 5 demonstrates a memory effect. During the sweep from negative to positive fields, the DW enters the pinning site at about H=70 Oe and the voltage rises from V/I=−10.8Ω (red trace, H=50Ω) to −7.7Ω (H=110Ω). The sweep is stopped at H=+110 Oe and is then reversed (blue trace) to H=200 Oe. The voltage shows a square hysteresis loop and, in particular, remains in the high state, V/I=−7.5Ω, at H=0. This demonstrates a memory effect because it shows two stable device states. The state with a trapped DW, V/I=−7.5Ω, is maintained in a non-powered (nonvolatile) circuit condition. The state with no pinned DW, V/I=−10.8Ω, also is a stable state at H=0. For this device, an interrupted field sweep during the sweep downward from +200 Oe to negative values would result in a third stable state with V/I~−14.5Ω. In summary, the invention exhibits three stable nonvolatile states that in prototype structures differ by ΔV/I~4Ω. Each state can be set (written) by using external magnetic field or STT current pulses. Most digital device applications, such as a storage cell in an MRAM array, require use of two of the stable states.

Figure 6:
FIG. 6 is a graph of data demonstrating an integrated write process, i.e. STT switching (writing), with an assist field, for the device of FIG. 4.

The data in FIG. 6 demonstrate an integrated write process. A domain wall is trapped at the constriction by using a magnetic field sequence such as described above. In the demonstration of FIG. 6, an "assist field" of H~100 Oe is applied. With reference to FIG. 4, the "assist field" corresponds to the middle of the blue peak in the quasistatic V-H trace. For this device, the baseline voltage is $V_B/I$~−4.2Ω, and the "high" voltage with the DW trapped at the pinning site is V/I~−0.3Ω. The plot of FIG. 6 shows Hall voltage as a function of time (bottom axis). At a time of approximately 110 sec, a current pulse of duration 100 ns and amplitude of 1 mA is transmitted down the FW. The current applies sufficient spin torque transfer (STT) to the domain wall that the DW is depinned from the constriction and moves further down the wire. The data of FIG. 6 demonstrate that an integrated current pulse can be used to change the state of the device. In this case an assist field was used for the proof of principle. However, switching between states can be performed in a ferromagnetic wire, with optimally engineered and fabricated pinning site, using only STT current pulses.

The invention offers several important features and advantages that apply to integrated device (MRAM) applications. The most important comparison is with the dominant MRAM storage cell that is based on the MTJ:

1. Low device impedance and low operational power: MTJs are characterized by the product of tunneling resistance R and device area A. As already noted above, the best MTJs have an RA product of 0.1 to 1.0 kΩ-μm². For a feature size with linear dimension of f=50 nm, the MTJ resistance (the device impedance) is 40 to 400 kΩ. For the write process, STT current pulses are typically driven across this resistance and there is high power dissipation, with joule heating, during the process. For the readout process, the large device resistance is a poor match to the characteristic impedance of digital electronic circuitry, 50Ω. The poor match results in diminished readout sensitivity. We further note that present MTJ technology is using a feature size of about 32 nm. By contrast, the write impedance (input impedance) for the invention is set by the resistance of the FW and may be as small as a few Ω. This resistance can be increased to 50Ω to match CMOS circuitry. The write process requires comparable values of current amplitude as the MTJ and the result is much lower dissipated power, and lower joule heating, during the write process. The readout impedance of the invention, determined by the characteristic sheet resistance $R_S$ of the 2DES, is typically given by $R_S$ times a factor of 2 or 3. Since the value of $R_S$ for our prototypes is about $R_S$~200Ω, an output (readout) impedance of about 600Ω can be expected. This is 2 or 3 orders of magnitude smaller than that of the MTJ. The loss of sensitivity because of impedance mismatch is relatively small.

2. Large ΔR and large output voltage: Using first generation prototype devices, we have observed values of ΔR as large as 8Ω and readout voltages of $V_{RO}$~1 mV. Our prototype devices are not optimized and the limits of readout bias have hardly been reached. It is quite reasonable to expect increases of $V_{RO}$ of one or two orders of magnitude. Such values are more than adequate for MRAM.

3. Durability: The large MTJ device impedance results in joule heating and stress on the tunnel barrier during write processes. The tunnel barrier becomes susceptible to dielectric breakdown and the durability is thereby diminished. The write process of the invention involves low impedance and no limits to durability are known to exist.

A comparison with prior art hybrid Hall effect devices (HHD) shows:

STT write: The prior art hybrid Hall device used the Oersted write process in which local magnetic fields associated with current pulses applied to inductively coupled write wires set the magnetization state of the F element. This process requires high operational power and is not scalable. The invention uses a STT write process, requiring much lower operational power, and is scalable.

Smaller cell: The cell size of the prior art HHD was determined by the lithographic feature size. With the invention, the smallest feature in one dimension (y in FIG. 3) is the DW width. This distance depends on materials parameters but may be 10 nm or less.

Less cross talk: The fringe fields associated with the F element of the prior art HHD are sufficiently large that crosstalk with neighboring cells is a concern. Fringe fields related to the DW in the present invention are more highly localized and the possibility of cross-talk is diminished. A related issue is that the film thickness of the FW in the invention can be quite small, by contrast with the relatively thick film required for the F element in the prior art HHD. Fabrication is simpler and the magnitude of dipolar fields is reduced.

Additional advantages of the invention include:

Simple cell: The cell design is simple, requiring a single Hall cross, a single ferromagnetic wire, and a thin electrically insulating between them. The magnetic characteristics of the FW might be optimized by the use of other materials components, but magnetic engineering is much simpler than that associated with the two separate ferromagnetic layers of a MTJ.

Inverse scaling: As was the case with prior art HHD, fabrication of the Hall cross with smaller dimensions succeeds in more efficient coupling to the fringe magnetic fields of the DW. This means that the readout characteristics scale inversely: the readout ΔR increases as the feature size decreases. At the same time, there is no known degradation to the DW at smaller dimensions and STT write processes have been shown to scale with decreasing dimensions.

As discussed above, the device has three stable nonvolatile states. Any two of these states can be used for digital applications. For example, an optimized device may show the best characteristics when operating with two states given by (i) head to head pinned DW and (ii) no pinned DW. Alternatively, an optimized device might use the two states given by (i) head to head pinned DW and (ii) tail to tail pinned DW. Furthermore, there may be applications where all three stable states can be used.

Additional embodiments of device 100 are feasible, since as noted in the prior art HHD, it's not necessary to use a Hall cross with 4 arms. A smaller cell can be realized by using a 3 arm Hall cross and measuring voltage with respect to a ground at one of the current bias arms.

The Hall device also can be operated in a "split-current mode," sometimes called a split drain mode, in which bias current is applied to two source contacts and grounded at two drain contacts. In zero field exactly half of the sourced current flows through each pair of contacts and, upon application of a perpendicular magnetic field, the current will deflect according to the Hall angle resulting in a flow of current perpendicular to the contacts, which is measured as the Hall current. A three terminal device, also known as a split drain device, is manufactured with a common source and two drains. The sum of the current through the two drains is constant, but more current will flow through one drain at the expense of the other when a perpendicular magnetic field is present.

The invention can be used as a sensor, for example a sensor in the read head of a hard disk drive, if the following modification is made. The DW pinning site should be engineered so that H=50 Oe there is a steep (nearly vertical) rise in voltage. With an appropriate pinning site, this rise in voltage could be a linear slope that extends over a range of tens of Oe, for example from H=50 to H=80 Oe. If such a quasistatic characteristic were to be reproducibly linear (rather than hysteretic) with small changes of field $\Delta H$ (changes with both increasing and decreasing values of $\Delta H$), the resulting structure can be used as a field sensor. The primary advantage in comparison with the MTJ is that the invention has a low impedance. MTJ sensors have a high device impedance and there is a large impedance mismatch with sense amplifier circuits. Mark Johnson, B. R. Bennett, P. R. Hammar and M. M. Miller, "Magnetoelectronic Latching Boolean Gate," Solid State Electronics 44, 1099 (2000) describes a reconfigurable magnetoelectronic logic gate based on a Hybrid Hall device (HHD). The same functions can be performed with the present invention.

It should be noted that, while the present invention has been described with respect to prototypical embodiments thereof, it will be understood by those of ordinary skill in the art that variations and modifications can be effected within the scope and spirit of the invention.

What is claimed as new and desired to be protected by Letters Patent of the United States is:

1. A hybrid domain wall Hall cross device, comprising:
a semiconductor Hall cross having a top surface and a pair of arms intersecting at a center region;
and a ferromagnetic wire fabricated on the top surface, electrically isolated from the Hall cross, and having a constriction proximate to the center of the Hall cross, said ferromagnetic wire having a first end and a second end, and wherein each said end terminates in an electrode whereby upon pulses of current being applied thereto a domain wall correlated with a binary state is established.

2. The device of claim 1, wherein the Hall cross has a size in the range of from 10 nm to 1 micron, the wire has a width in the range of from 10 nm to 500 nm, the wire is continuous and extends from a first end of the Hall cross to a second opposing end of the Hall cross, and the wire terminates at each such end in an electrode whereby upon pulses of current being applied thereto a domain wall correlated with a binary state is established.

3. The device of claim 1, wherein the Hall cross is an InAs heterostructure.

4. The device of claim 3, wherein the heterostructure is InAs/InAlSb.

5. The device of claim 1, wherein the Hall cross is Si or Ge or a compound of either Si or Ge.

6. A hybrid domain wall Hall cross memory device, comprising:
a semiconductor Hall cross having a top surface and a pair of arms intersecting at a center region;
and a ferromagnetic wire fabricated on the top surface, electrically isolated from the Hall cross, having a constriction proximate to the center of the Hall cross, and having at least two configurable and stable magnetization orientation states corresponding to two different values of a data item stored in said device, and covering a portion of the top surface such that a fringe magnetic field having two states and configured substantially normal to the top surface can be generated by an edge portion of the ferromagnetic wire; and
wherein two different electrical signals, each corresponding to a different one of the two different data values, can be generated in response to the two fringe magnetization field states acting on an electrical current flowing in the top surface, and said ferromagnetic wire having a first end and a second end wherein each said end terminates in an electrode whereby upon pulses of current being applied thereto a domain wall correlated with a binary state is established.

7. A nonvolatile memory array comprising a plurality of hybrid domain wall Hall cross memory cells, wherein each said cell comprises:
a semiconductor Hall cross having a top surface and a pair of arms intersecting at a center region; and
a ferromagnetic wire fabricated on the top surface, electrically isolated from the Hall cross, having a constriction proximate to the center of the Hall cross, and having at least two configurable and stable magnetization orientation states corresponding to two different values of a data item stored in said device, and covering a portion of the top surface such that a fringe magnetic field having two states and configured substantially normal to the top surface can be generated by an edge portion of the ferromagnetic wire; and
wherein two different electrical signals, each corresponding to a different one of the two different data values, can be generated in response to the two fringe magnetization field states acting on an electrical current flowing in the top surface, and said ferromagnetic wire having a first end and a second end wherein each said end terminates in an electrode whereby upon pulses of current being applied thereto a domain wall correlated with a binary state is established.

8. The nonvolatile memory array of claim 7, wherein at least one field effect transistor is incorporated in each cell to isolate the cell from the array.

9. The nonvolatile memory array of claim 7, wherein at least one field effect transistor is incorporated in each cell to control the write current applied to the FW of each cell.

10. The device of claim 1, further comprising a current source coupled to the electrodes wherein one of said electrodes is coupled to the current source and comprising an $I_{write}$ terminal with the other electrode coupled to ground.

11. The device of claim 2, further comprising a current source coupled to the electrodes wherein one of said electrodes is coupled to the current source and comprising an $I_{write}$ terminal with the other electrode coupled to ground.

12. The device of claim 6, further comprising a current source coupled to the electrodes wherein one of said electrodes is coupled to the current source and comprising an $I_{write}$ terminal with the other electrode coupled to ground.

13. The device of claim 7, further comprising a current source coupled to the electrodes wherein one of said electrodes is coupled to the current source and comprising an $I_{write}$ terminal with the other electrode coupled to ground.

14. The device of claim 8, further comprising a current source coupled to the electrodes wherein one of said electrodes is coupled to the current source and comprising an $I_{write}$ terminal with the other electrode coupled to ground.

15. The device of claim 9, further comprising a current source coupled to the electrodes wherein one of said electrodes is coupled to the current source and comprising an $I_{write}$ terminal with the other electrode coupled to ground.

* * * * *